(12) United States Patent
Schmidtke et al.

(10) Patent No.: US 9,362,470 B2
(45) Date of Patent: Jun. 7, 2016

(54) OPTOELECTRONIC DEVICE, OPTICAL ELEMENT AND METHOD FOR PRODUCING SAME

(71) Applicant: OSRAM Opto Semiconductors GmbH, Regensburg (DE)

(72) Inventors: Kathy Schmidtke, Bad Abbach (DE); Michael Kruppa, Geisenfeld (DE); Bert Braune, Wenzenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/428,345

(22) PCT Filed: Sep. 6, 2013

(86) PCT No.: PCT/EP2013/068491
§ 371 (c)(1),
(2) Date: Mar. 13, 2015

(87) PCT Pub. No.: WO2014/044558
PCT Pub. Date: Mar. 27, 2014

(65) Prior Publication Data
US 2015/0243859 A1    Aug. 27, 2015

(30) Foreign Application Priority Data
Sep. 19, 2012    (DE) .......................... 10 2012 108 828

(51) Int. Cl.
*H01L 33/00*    (2010.01)
*H01L 33/58*    (2010.01)
(Continued)

(52) U.S. Cl.
CPC . *H01L 33/58* (2013.01); *C09K 5/14* (2013.01); *H01L 31/024* (2013.01);
(Continued)

(58) Field of Classification Search
CPC ....................................................... H01L 33/58
USPC ............................................................ 257/98
See application file for complete search history.

(56) References Cited

U.S. PATENT DOCUMENTS 6,592,780 B2    7/2003    Höhn et al.
2009/0093579 A1*  4/2009    Kanamori .............. C08G 77/44
524/430

(Continued)

FOREIGN PATENT DOCUMENTS

DE    102008030253 A1    12/2009
DE    102010034913 A1    2/2012
(Continued)

OTHER PUBLICATIONS

Machine Translation of JP 2009-091380.*
(Continued)

*Primary Examiner* — Anthony Ho
(74) *Attorney, Agent, or Firm* — Slater Matsil, LLP

(57) ABSTRACT

A method for producing an optoelectronic device and an optoelectronic device is disclosed. According to at least one embodiment, an optoelectronic device is provided, which comprises a housing, a radiation-emitting or radiation-receiving semiconductor chip which is arranged in the housing, and an optical element which is arranged in a beam path of the device. The optical element comprises an amphiphilic block copolymer which contains polysiloxane as a hydrophobic polymer and a hydrophilic polymer cross-linked therewith. The optical element further comprises thermally conductive nanoparticles which are distributed in the amphiphilic block copolymer and comprise a material which is selected from the group comprising a metal, a metal oxide, a metal hydroxide and a combination thereof.

8 Claims, 4 Drawing Sheets

(51) Int. Cl.

| | | |
|---|---|---|
| H01L 33/56 | (2010.01) | |
| H01L 33/64 | (2010.01) | |
| C09K 5/14 | (2006.01) | |
| H01L 31/0232 | (2014.01) | |
| H01L 31/024 | (2014.01) | |
| H01L 31/18 | (2006.01) | |
| B82Y 40/00 | (2011.01) | |
| B82Y 99/00 | (2011.01) | |

(52) U.S. Cl.
CPC ......... *H01L 31/02327* (2013.01); *H01L 31/18* (2013.01); *H01L 33/005* (2013.01); *H01L 33/56* (2013.01); *H01L 33/641* (2013.01); *H01L 33/644* (2013.01); *B82Y 40/00* (2013.01); *B82Y 99/00* (2013.01); *H01L 2224/48091* (2013.01); *H01L 2224/48227* (2013.01); *H01L 2933/0058* (2013.01); *H01L 2933/0075* (2013.01); *H01L 2933/0091* (2013.01); *Y10S 977/773* (2013.01); *Y10S 977/896* (2013.01)

(56) References Cited

U.S. PATENT DOCUMENTS

| | | |
|---|---|---|
| 2010/0036033 A1 | 2/2010 | Hirano |
| 2013/0207148 A1 | 8/2013 | Kräuter et al. |
| 2014/0175478 A1 | 6/2014 | Wirth |

FOREIGN PATENT DOCUMENTS

| | | |
|---|---|---|
| DE | 102010034915 A1 | 2/2012 |
| EP | 1995281 A1 | 11/2008 |
| EP | 2236553 A1 | 10/2010 |
| JP | 200991380 A | 4/2009 |
| WO | 9812757 A1 | 3/1998 |
| WO | 2009155907 A2 | 12/2009 |

OTHER PUBLICATIONS

Geidel, C., "Control of the interface properties of inorganic nanoparticles with the help of amphiphilic polymers," Sep. 28, 2012, 15 pages.

Im, H., et al., "Enhancement of Electrical and Thermal Conductivities of a Polysiloxane/Metal Complex with Metal Oxides," Polymer Composites, Oct. 2010, 1669-1677 pages, vol. 31, Issue 10, Society of Plastics Engineers.

Im, H., et al., "Enhancement of the thermal conductivity of aluminum oxide-epoxy terminated poly(dimethyl siloxane) with a metal oxide containing polysiloxane," Journal of Materials Science, May 13, 2011, 6571-6580 pages, vol. 46, Issue 20, Springer.

Kim, Y.W., et al., "In Situ Formation of Silver Nanoparticles Within an Amphiphilic Graft Copolymer Film," Journal of Polymer Science: Part B: Polymer Physics, Jun. 2007, 1283-1290 pages, vol. 45, Issue 11, Wiley Periodicals, Inc.

Lin, G., et al., "Improved Hydrophilicity from Poly(ethylene glycol) in Amphiphilic Conetworks with Poly(dimethylsiloxane)," Silicon, Jul. 2009, 173-181 pages, vol. 1, Issue 3, Springer Netherlands.

* cited by examiner

OPTOELECTRONIC DEVICE, OPTICAL ELEMENT AND METHOD FOR PRODUCING SAME

This patent application is a national phase filing under section 371 of PCT/EP2013/068491, filed Sep. 6, 2013, which claims the priority of German patent application 10 2012 108 828.4, filed Sep. 19, 2012, each of which is incorporated herein by reference in its entirety.

TECHNICAL FIELD

The invention relates to an optoelectronic device, an optical element for such a device and a method for producing the optical element and the device.

BACKGROUND

In optoelectronic devices, e.g., light-emitting diodes (LEDs), silicones are frequently used as casting materials. However, conventional silicones have a low thermal conductivity of approximately 0.2 W/(m*K), which means that in the longer term embrittlement and cracking can occur in the silicone casting compound owing to thermal loading during operation of the device. The luminous efficiency of the device is hereby impaired and the service life thereof is reduced since moisture or harmful gasses can penetrate into the device.

In order to alleviate these disadvantageous effects, spherical $SiO_2$ particles, in particular in the µm range, are optionally added to a casting silicone, whereby the thermal conductivity of the casting compound is moderately increased. Generally, this is less than 0.4 W/(m*K). However, $SiO_2$ particles may require careful adaptation of the refractive index of the silicone since otherwise the luminous efficiency of the device is greatly reduced owing to light scattering. Therefore, it is desirable to provide optoelectronic devices or optical elements which have a further improved thermal conductivity and as far as possible have a small amount of light scattering in the optical element, which permits a high luminous efficiency.

SUMMARY OF THE INVENTION

Embodiments of the invention reside in the provision of an optoelectronic device, the optical element of which has an improved thermal conductivity and as far as possible causes a small amount of light scattering. Further objects are the provision of a method for producing the optoelectronic device and such an optical element, and the optical element itself.

An optoelectronic device is described. According to at least one embodiment, the optoelectronic device comprises: a housing, a radiation-emitting or radiation-receiving semiconductor chip which is arranged in the housing, an optical element which is arranged in a beam path of the device, wherein the optical element contains an amphiphilic block copolymer which contains polysiloxane as a hydrophobic polymer and a hydrophilic polymer cross-linked therewith, and wherein thermally conductive nanoparticles which are distributed in the amphiphilic block copolymer and comprise a material which is selected from the group comprising a metal, a metal oxide, a metal hydroxide and a combination thereof.

According to the application, the optoelectronic device can also be designated in short as "device". Similarly, the amphiphilic block copolymer can be designated in short as "block copolymer", the thermally conductive nanoparticles as "nanoparticles" and the radiation-emitting or radiation-receiving semiconductor chip as "semiconductor chip" or "chip".

The term "on" is understood according to the application to mean the direct, i.e., immediate arrangement of elements with a common boundary surface and also an indirect arrangement in which further elements can be provided between the elements arranged one on the other. In a similar manner, an element is arranged "between" a first and a second element when the element is arranged on the first element and the second element is arranged on the side of the element remote from the first element, wherein the term "on" is understood as described above.

The "beam path of the element" means any possible paths via which radiation from the semiconductor chip can exit from and/or can be coupled out of the device or, in the case of radiation-receiving semiconductor chips, can be coupled into the device and can enter the chip. According to the application, the terms "beam path" and "beam path of the device" are used synonymously.

The amphiphilic properties of the block copolymer are based on the fact that it contains a hydrophobic polymer and a hydrophilic polymer cross-linked therewith. The block copolymer hereby has hydrophobic and hydrophilic properties or regions. Synonyms for "polymer" are in this case "polymer chain" or "polymer string"; they are polymeric molecular parts of the block copolymer which are cross-linked with each other and of which a plurality can be contained in each case. "Hydrophobic" and "hydrophilic" are common terms from the field of chemistry and the material sciences and are used accordingly within this application. Hydrophobic substances, materials or molecular parts thus are not, or are hardly, miscible with water, soluble in water or produce substantially only van der Waals interactions with water. Hydrophilic substances, materials or molecular parts behave conversely and can generally also produce hydrogen bonds with water.

It has surprisingly been found that in the amphiphilic network of the block copolymer thermally conductive nanoparticles can be produced in situ, i.e., directly in the block copolymer, e.g., by chemical reaction. This results in the fact that the thermally conductive nanoparticles are distributed in the optical element in a particularly fine and homogeneous manner. Undesired agglomeration or sedimentation can be substantially or completely reduced. In contrast thereto, when producing conventional optical elements, prefabricated particles are mixed with a silicone so that these can agglomerate and subside.

A further advantage of the in situ production of the nanoparticles is that very small particle sizes can be achieved. According to the application, nanoparticles have an average diameter of less than 100 nm. In order to be able to finely distribute such small particles in conventional silicones, mixing processes lasting for hours are occasionally required. However, there is still the risk of agglomeration and sedimentation.

Owing to the thermally conductive nanoparticles present in the amphiphilic block copolymer, more precisely in the cavities of the network, the thermal conductivity within the optical element is significantly increased so that heat energy can be better dissipated through the optical element. The mixture of amphiphilic block copolymer and nanoparticles distributed therein can generally have a thermal conductivity of ≥0.4 W/(m*K), in particular ≥0.6 W/(m*K). The thermal conductivity can be, for example, in the range of 0.4 to 5 W/(m*K), in particular 0.6 to 3 W/(m*K), which means that this is significantly increased compared with conventional silicones which have SiO$_2$ particles added thereto. Generally, at least 80 wt. %, in particular at least 90 wt. %, for example, at least 95 wt. % of the polymeric compounds in the optical element can be amphiphilic block copolymers (wt. %=weight percent). All the polymeric compounds in the optical element can also be amphiphilic block copolymers.

The high thermal conductivity in the optical element can be traced back in particular to the thermally conductive nanoparticles. According to at least one embodiment, "thermally conductive" is understood to mean materials which have a thermal conductivity of ≥3 W/(m*K), in particular ≥5 W/(m*K). The thermal conductivity of the nanoparticles can preferably be ≥10 W/(m*K).

The material of the nanoparticles or the nanoparticles themselves can consist substantially, e.g., to at least 90 wt. %, in particular at least 95 wt. %, or completely, of a metal, a metal oxide, a metal hydroxide or a combination thereof. The "metal" can be a metal in the actual sense and/or a semimetal, in particular a metal in the actual sense. Likewise, the underlying metal in the "metal oxide" and in the "metal hydroxide" can be a metal in the actual sense or a semimetal, wherein it is in particular a metal in the actual sense. The semimetals include boron (B), silicon (Si), germanium (Ge), arsenic (As), antimony (Sb), selenium (Se) and tellurium (Te). "Metals in the actual sense" are thus alkali metals, alkaline earth metals, transition metals and the elements of the third to sixth main groups with a higher atomic number than the semimetals of the respective main group. A selection can be made in particular from the transition metals.

Owing to the improved thermal conductivity, heat energy can be effectively dissipated through the optical element, e.g., away from the semiconductor chip, to the surface of the optical element. The optical element can be connected in particular in a thermally conductive manner to the semiconductor chip, which can be designed, e.g., in the form of an at least partially surrounding casting compound. Owing to the improved thermal conductivity or the improved thermal management in the optical element, damage caused by the effects of heat during operation of the device, in particular embrittlement and cracking, is avoided or at least delayed. The service life of the device is hereby increased and a high light transmission through the optical element is ensured over a long period of time. In the case of light-emitting devices, a high luminous efficiency can thus also be retained over a long period of time.

The thermally conductive nanoparticles have in particular an average diameter which is considerably smaller than the wavelength of visible light (approximately 400 to 800 nm) which means that no, or hardly any, light scattering occurs thereon. Therefore, the thermally conductive nanoparticles also have no, or hardly any, negative effect on the transmission of light through the optical element. There is thus no need to effect complex adaptation of the refractive index, as is often required with a conventional optical element consisting of silicone with SiO$_2$ particles. In the optical element according to the application, owing to the combination of amphiphilic block copolymer and thermally conductive nanoparticles, which can be produced in particular in situ in the block copolymer, the thermal conductivity is thus significantly increased and nevertheless a high transmission of light or a high luminous efficiency is ensured.

The polymers or polymer chains of the amphiphilic block copolymer can comprise on average at least 100 monomer units, in particular at least 500 monomer units. The hydrophobic polymer in the amphiphilic block copolymer is a polysiloxane, i.e., a silicone which means that the monomer units are siloxanes. The polysiloxane can be in particular a poly(dialkyl siloxane), a polyalkylaryl siloxane, a poly(diaryl siloxane) and a combination thereof. "Aryl" substituents also include, according to the application, substituted aromatic substituents. "Alkyl" substituents can be formed in a linear, branched or even cyclic manner.

According to a further embodiment, the substituents of the polysiloxane are selected from methyl, cyclohexyl, phenyl and a combination thereof. The polysiloxane can be, for example, poly(dimethyl siloxane), poly(dicyclohexyl siloxane), a polymethylphenyl siloxane, poly(diphenyl siloxane) and a combination thereof. In particular, it can be a poly(dimethyl siloxane).

According to a further embodiment, the mass ratio of hydrophobic polymer to hydrophilic polymer in the amphiphilic block copolymer is from 50:50 to 95:5, in particular from 60:40 to 90:10. The amphiphilic block copolymer thus predominately contains polysiloxanes, i.e., hydrophobic polymer proportions, and thus also has the positive properties of polysiloxanes. These are characterised in particular in that they have a high sealing tightness with respect to air moisture and harmful gasses, e.g., nitrogen, and are transparent. The amphiphilic block copolymer can comprise hydrophobic polymers (polysiloxanes) and hydrophilic polymers in a ratio of at least 70:30, in particular at least 80:20. It has surprisingly been found that even in the case of such a high proportion of polysiloxane, i.e., hydrophobic polymers in the block copolymer, a uniform distribution and in situ production of the thermally conductive nanoparticles in the block copolymer are possible without there being any appreciable agglomeration of the nanoparticles.

According to one further embodiment, the hydrophilic polymer is selected from the group comprising polyethylene glycol (PEG), polyacrylamides such as, for example, poly(N-isopropyl acrylamide), polyacrylic acid, poly(methylvinylether-alt-maleic acid anhydride), poly(methylvinylether-alt-maleic acid), poly(isobutene-co-maleic acid), poly(2-ethyl acrylic acid), poly(2-hydroxyethyl methacrylate), poly(2-propyl acrylic acid) and a combination thereof. The hydrophilic polymer is preferably selected from the group comprising polyethylene glycol, polyacrylic acid, poly(methylvinylether-alt-maleic acid anhydride) and a combination thereof.

The stated hydrophilic polymers of the block copolymer permit in particular effective production and uniform, homogeneous distribution of the thermally conductive nanoparticles. The constituents of the block copolymer, i.e., the hydrophilic and hydrophobic polymers or polymer chains, can be detected by NMR spectroscopy.

The production of an amphiphilic block copolymer is described, for example, in the publication by G. Lin, X. Zhang, S. R. Kumar, J. E. Mark, Silicon 2009, Vol. 1, 173-181, the disclosure content of which in this respect is hereby incorporated by reference.

According to a further embodiment, the nanoparticles have an average diameter of ≤50 nm, in particular 5 to 40 nm. This is smaller, by a multiple, than the wavelength of the visible light, which is thus not, or is hardly, scattered at the nanoparticles. The average particle diameter can be determined via sections through the optical element and subsequent analysis using the scanning electron microscope (SEM). The small diameter and homogeneous distribution of the nanoparticles in the optical element can be traced back in particular to the in situ production in the amphiphilic block copolymer, as described further hereinunder with the aid of the production method according to the application.

According to a further embodiment, the nanoparticles comprise a material selected from the group comprising cobalt, gold, silver, platinum, lanthanide hydroxide, lanthanide oxide, aluminium oxide and a combination thereof. The nanoparticles can consist substantially, i.e., to at least 90 wt. %, or completely, of the material. The materials can be detected via powder diffractometry and energy-dispersive X-ray spectroscopy (EDX). Lanthanum and the fourteen elements in the periodic table from cerium to lutetium are attributed to the lanthanides. It is preferred to use lanthanum as lanthanide. The nanoparticles preferably comprise a material selected from the group comprising cobalt, gold, platinum, silver, lanthanum hydroxide ($La(OH)_3$), and a combination thereof. The nanoparticles preferably comprise a material selected from the group comprising cobalt, gold, silver, lanthanum hydroxide ($La(OH)_3$), and a combination thereof.

According to a further embodiment, the optical element contains up to 40 vol. % of thermally conductive nanoparticles (vol. %=volume percent). The optical element can comprise a nanoparticle content in the range of 5 to 35 vol. %. It comprises, for example, a concentration of at least 10 vol. %, whereby a considerable increase in the thermal conductivity of the optical element is already obtained. In the case of higher concentrations of nanoparticles, the thermal conductivity is further increased. Generally, in the case of electrically conductive nanoparticles, i.e., nanoparticles which consist, as described above, at least substantially of metal or another electrically conductive material, a content of up to 20 vol. % is used in order to avoid the formation of electrically conductive paths which means that short-circuits can be avoided within the optical element during operation of the device. If the optical element is electrically isolated from the parts of the device operated with current, then higher concentrations of electrically conductive nanoparticles can also be present.

According to a further embodiment, the nanoparticles form in the optical element percolation paths. Percolation paths are understood to be cohesive paths of particles. Such percolation paths are generally statistically formed from a concentration of approximately 28 to 35 vol. % of nanoparticles in the optical element. Since the percolation paths extend through the optical element, a markedly effective dissipation of heat energy can occur via said paths. For example, heat from the semiconductor chip can travel via the percolation paths to the surface of the optical element and thus from the system or to a heat sink possibly present in the device. The percolation paths can form a network within the optical element which means that, together with the amphiphilic block copolymer, an interpenetrating network is obtained.

According to a further embodiment, the optical element comprises particles containing converter materials. Converter materials are particularly used in light-emitting embodiments of the device and are used to convert portions of, or all of, a radiation, which is emitted from the semiconductor chip and is of a first wavelength, into a second longer wavelength (so-called "Down Conversion"). The device according to the application can thus emit light of any colour impression, for example, white. The particles containing converter materials can be finely distributed in the optical element (so-called volume conversion). Within the scope of the present application, the selection of the converter material is unrestricted. Basically, all the converter materials known to the person skilled in the art and suitable for a light-emitting device, e.g., an LED, can be used. Suitable converter materials are, for example, described in WO 98/12757 A1, the disclosure content of which in this respect is hereby incorporated by reference. According to the application, converter materials are not included in the thermally conductive nanoparticles.

Owing to the good thermal conductivity of the optical element according to the application, the heat energy formed by conversion (conversion heat) can be effectively dissipated from the converter materials. On the one hand, a high constant of the chromaticity co-ordinate in the CIE diagram, i.e., a low temperature-dependent chromaticity co-ordinate shift, is hereby obtained for the radiation emitted by the device. Furthermore, damage caused by ageing and overheating phenomena owing to conversion heat in the device can be substantially or completely avoided. In a conventional optical element, e.g., a silicone casting compound, the conversion heat can accumulate and thus result in damage since silicones act more like thermal insulators owing to the low thermal conductivity.

According to one development of this embodiment, the optical element comprises particles which contain converter materials and which, together with the nanoparticles, form percolation paths. According to this embodiment, an interpenetrating network consisting of the amphiphilic block copolymer on the one hand and the percolation paths consisting of particles with converter materials and the thermally conductive nanoparticles on the other hand is thus present within the optical element. Since the converter material particles are integrated in the percolation paths, the conversion heat can be particularly effectively dissipated via these paths. This results in the advantages mentioned above, namely the avoidance of overheating and a very stable chromaticity co-ordinate of the radiation emitted by the device. In this embodiment of the device according to the application, the optical element can contain overall up to 50 vol. % of particles containing converter materials and nanoparticles together. The content can be present in the range of 15 to 45 vol. %, in particular 20 to 40 vol. %. If the converter materials themselves are not electrically conductive, the percolation paths can also be formed together with metallic nanoparticles without short-circuits occurring during operation of the device.

According to a further embodiment, the optical element is a casting compound which at least partially surrounds the semiconductor chip. For this purpose, the semiconductor chip can be arranged, for example, in a recess of the housing which is then partially or completely filled with the optical element. In this embodiment, the optical element can also be shaped to form a lens. A lens separate from the casting compound can also be arranged in the beam path. Heat can be effectively transported by the direct contact between the semiconductor chip and the optical element. This embodiment is also suitable for so-called volume conversion in which particles containing converter materials are distributed in the optical element.

According to a further embodiment, the device is, or comprises, a light-emitting diode (LED).

The device can further comprise constituents and elements which are typically used for successful operation of an optoelectronic device. It comprises in particular the required electrically conductive connections, e.g., lead frames, bond pad, bond wire or the like, in order to contact the semiconductor chip. The type of housing is likewise unrestricted according to the application. It preferably consists of a radiation-resistant and heat-resistant material. It can comprise reflective materials in order to increase the out-coupling of light. The housing can be connected to, or comprise, a carrier substrate, for example.

If a light-scattering optical element is desired, this can also comprise scattering particles, e.g., consisting of $TiO_2$, $ZrO_2$, $Al_2O_3$ and a combination thereof. Scattering particles generally have an average diameter of more than 400 nm, e.g., 400 nm to 7 µm. Therefore, according to the application, the scattering particles are not included in the nanoparticles.

In a further aspect of the application, a method for producing an optical element for an optoelectronic device is provided. According to at least one embodiment, the method comprises the steps of: A) providing an amphiphilic block copolymer which contains polysiloxane as a hydrophobic polymer and a hydrophilic polymer cross-linked therewith; B) introducing a solution, a suspension or a dispersion of a precursor in a first solvent; C) converting the precursor into thermally conductive nanoparticles; and D) at least partially removing the first solvent, wherein the optical element is formed, in which thermally conductive nanoparticles are distributed in the amphiphilic block copolymer and comprise a material which is selected from the group comprising a metal, a metal oxide, a metal hydroxide and a combination thereof.

The method for producing the optical element can also be designated as "method" for short. The method can be used to produce an optical element which is a constituent of at least one of the above-described embodiments of the device according to the application, which means that the above statements can be applied to, and are also valid for, the method. This relates in particular to said materials, properties and advantages of the optical element.

Method steps A), B), C) and D) can be performed one after the other in the stated sequence or can also partially or completely overlap one another. The latter case can apply in particular for steps B), C) and D). For example, the conversion of the precursor into thermally conductive nanoparticles can already start before step B) has completely finished. This can be the case, for example, when the solution, suspension or dispersion was previously heated or step B) is effected at elevated temperatures. Elevated temperatures are temperatures higher than room temperature (25° C.). Likewise, or instead, steps C) and D) can also overlap. That is to say that at least a portion of the solvent used can be removed, for example, even during the conversion of the precursor into the thermally conductive nanoparticles.

A "precursor" is understood to be a chemical precursor, a reactant or a starting compound. It is a material, a compound or a mixture of compounds, from which the thermally conductive nanoparticles or the material thereof is generally formed by a chemical reaction in step C). The nanoparticles are thus generally produced "in situ" (on site), i.e., principally directly in the amphiphilic block copolymer.

It has surprisingly been found that undesired agglomeration and sedimentation, as can occur during mixing of particles with a conventional silicone, are hereby (substantially) avoided. The in situ production of the thermally conductive nanoparticles in the amphiphilic block copolymer of the optical element rather effects a homogeneous distribution and produces only slightly agglomerated nanoparticles. These advantages are based on the combination of several causes, as shown hereinafter.

The amphiphilic block copolymer provided in step A) comprises a polysiloxane as a hydrophobic polymer which is at least partially cross-linked with a hydrophilic polymer. The polymer chains in the amphiphilic block copolymer form a type of network in which hollow spaces or cavities are present.

It is in particular the hydrophilic polymer chains of the block copolymer which permit the introduction of the solution, suspension or dispersion into the block copolymer in step B). The block copolymer can be bloated or swelled by the solvent, in particular in the region of the hydrophilic polymers. The first solvent can be in particular a polar solvent. The hollow spaces or cavities in the block copolymer are generally expanded by the bloating action. The precursor, e.g., a metal salt, can be distributed uniformly in the block copolymer such that the thermally conductive nanoparticles are also formed to be homogeneously distributed. This is not possible, or is only possible to a limited extent, with conventional mixing processes with particles of a diameter of <100 nm. Therefore, by simply bloating the amphiphilic block copolymer with the solution, suspension or dispersion of the precursor, drawn out mixing processes which occasionally last for hours are superfluous, whereby the production method is less labour intensive, is quicker and is more economic.

In method step B), the solution, suspension or dispersion can be added to the amphiphilic block copolymer. For this purpose, an excess pressure (higher than atmospheric pressure) can be applied in order to accelerate the "bloating" or "swelling" of the block copolymer. The precursor can be dissolved in particular in the first solvent. The first solvent can be a pure solvent or a solvent mixture.

In step C), the precursor compounds are then converted into the thermally conductive nanoparticles, which generally occurs by means of a chemical reaction. During this conversion, the nanoparticles can also be separated, precipitated or at least partially crystallised. In step C), elevated temperatures can be applied, for example, and/or reagents can be added which means that conditions other than those in step B) prevail and the conversion takes place. Furthermore, in addition or as an alternative, UV radiation can be applied, for example. The small average particle diameter and the homogeneous distribution of the nanoparticles can be traced back in particular to the production thereof at the smallest possible level by a chemical reaction, which occurs directly in the (bloated) amphiphilic block copolymer. The produced nanoparticles can be stabilised in particular by the hydrophilic polymers of the block copolymer, whereby undesired agglomeration is avoided.

In method step D), the first solvent is substantially or completely removed, wherein the optical element is formed. At best, traces of the solvent used remain in general in the optical element, wherein the traces can be less than 2 wt. %, in particular less than 1 wt. %, of the originally used first solvent. In order to remove the first solvent, a reduced pressure and/or an elevated temperature can be applied, for example. For example, a reduced pressure of 50 to 800 mbar, in particular 70 to 500 mbar, for example, 90 to 150 mbar, can be applied. In this case, the temperature can be increased to 30° C. to 75° C., in particular 40° C. to 60° C., for example, 50° C.

During method step D), the optical element or the amphiphilic block copolymer can also be hardened. Hardening or a hardening step as a sub-step generally follows a removal of solvents. A further cross-linking of the polymers can thereby occur. For the hardening, the temperature can be increased, for example, for at least one hour, e.g., 1 to 4 h, to at least 120° C., in particular 120° C. to 170° C., preferably 120° C. to 160° C. Generally, the temperature is increased for several hours to approximately 150° C. A compact, hard and thermally resistant optical element is particularly formed, which additionally has a high thermal conductivity and transmission for visible light.

During step D), and in some circumstances also during step C), with a sufficient concentration of nanoparticles, percolation paths can form in the amphiphilic block copolymer or in the produced optical element. For this purpose, as described above, corresponding concentrations of nanoparticles and optically also particles with converter materials can be used. For example, in step B) the precursor can be dissolved in the first solvent and particles with or consisting of converter material can be suspended therein. Alternatively, converter materials can also already be distributed in the provided block copolymer in step A) and do not need to be introduced in step B).

According to a further embodiment, the precursor is selected from the group comprising a metal carbonyl, a metal azide, a metal halide, a metal oxide, a metal hydroxide, a metal acetate, a metal sulphate, a metal nitrate and a combination thereof. Fundamentally, metal azides are suitable for the uses according to the application, but can occasionally represent a risk in operational safety. The precursor is preferably selected from the group comprising a metal carbonyl, a metal halide, a metal oxide, a metal hydroxide, a metal acetate, a metal sulphate, a metal nitrate and a combination thereof. Said compound types thereby also include possible derivatives, e.g., solvates or hydrates.

The material of the thermally conductive nanoparticles can be formed from the precursors by chemical reaction, i.e., a metal, a metal oxide or a metal hydroxide. For example, the metal can be released from a metal carbonyl by pyrolysis, wherein carbon monoxide (CO) can escape. A gaseous by-product can be expelled, for example, in step C) and/or D). Similar behaviour occurs in the case of a metal azide, wherein likewise the metal itself and nitrogen as a reaction product are produced. Metal halides, metal acetates or metal nitrates can be converted into the underlying metal, for example, by adding a reducing agent. Metal oxides or metal hydroxides can be precipitated and/or crystallised, for example, after introducing the precursor into the amphiphilic block copolymer, wherein metal hydroxides can optionally also be converted into a metal oxide.

According to one development of this embodiment, the precursor is selected from the group comprising dicobalt octacarbonyl, silver tetrachloroaurate, lanthanide chloride, lanthanide oxide, cobalt acetate, aluminium sulphate, silver nitrate, dihydrogen hexachloroplatinate (hexachloroplatinic acid, $H_2PtCl_6$), and a combination thereof. It is preferred to use lanthanum chloride and lanthanum oxide as lanthanide chloride and lanthanide oxide respectively. Dihydrogen hexachloroplatinate is included in the metal halides in this case.

The preferred precursors can be converted into a metal, a metal hydroxide or a metal oxide by the chemical reactions described above. For example, the pyrolysis of dicobalt octacarbonyl produces elementary cobalt. Silver tetrachloroaurate can be reduced with hydridic compounds to form silver and gold. Silver nitrate can be reacted with a reducing agent or be subjected to radiation, e.g., UV radiation, to form silver. Lanthanide chloride or lanthanide oxide can be precipitated and crystallised, for example, as lanthanide hydroxide (Ln$(OH)_3$). Owing to thermal effects, a lanthanide oxide compound can also be formed from the lanthanide hydroxide. Aluminium oxide can be formed from aluminium sulphate.

According to a further embodiment, in step C) the temperature is increased to at least 40° C. for the conversion. The temperature can be in particular in the range of 40° C. to 180° C., in particular 40° C. to 100° C. or 100° C. to 160° C., for example, approximately 150° C. Reducing reactions generally require lower temperatures of 40° C. to 100° C., in particular 45° C. to 80° C., preferably 45 to 60° C. Pyrolysis generally requires higher temperatures, i.e., higher than 100° C., in particular 100° C. to 160° C. In the case of such an embodiment, steps C) and D) can, for example, partially or completely coincide with one another. At such temperatures, a certain hardening of the amphiphilic block copolymer is possible.

According to a further embodiment, the conversion in step C) takes place by means of a reagent which is selected from the group comprising a catalyst, a reducing agent, a base and a combination thereof. The reagent can be in particular a reducing agent. A reducing agent can be in particular a hydridic compound, EDTA or hydrazine. In particular, the reagent can be selected from the group comprising sodium borohydride, hydrazine, triethylamine, a nitrate, EDTA, sodium hydroxide, potassium hydroxide and a combination thereof.

Sodium borohydride ($NaBH_4$) is suitable, for example, to reduce halide-containing compounds such as silver tetrachloroaurate to form silver and gold, which can then be present as a mixture. Bases such as sodium hydroxide (NaOH) or potassium hydroxide (KOH) can be used to precipitate lanthanide hydroxide, in particular lanthanum hydroxide, owing to a pH change. Cobalt acetate can be reacted with a combination of triethylamine and sodium borohydride or a combination of triethylamine and hydrazine to form cobalt. The reaction of aluminium sulphate and nitrate produces aluminium oxide. Silver nitrate can be reacted with sodium borohydride or EDTA to form silver. Dihydrogen hexachloroplatinate produces, for example, nanoparticles containing platinum in the reaction with sodium borohydride.

According to a further embodiment, one of the following reactions takes place in step C): silver tetrachloroaurate with sodium borohydride to form gold, lanthanum chloride to form lanthanum hydroxide, cobalt acetate with triethylamine and sodium borohydride to form cobalt, cobalt acetate with triethylamine and hydrazine to form cobalt, aluminium sulphate with nitrate to form aluminium oxide, silver nitrate with sodium borohydride to form silver, silver nitrate with EDTA to form silver, silver nitrate subjected to radiation, e.g., UV radiation, to form silver, or dihydrogen hexachloroplatinate with sodium borohydride to form platinum.

For the sake of clarity, details regarding all by-products are omitted here. These types of reaction are known to the person skilled in the art per se and in their own right.

According to a further embodiment, the method includes a washing step as additional method step E), in which a second solvent is introduced into the amphiphlic block copolymer and is then removed. Such a washing step can be used to remove by-products or decomposition products of the conversion in step C). Step E) can be performed before step D). Embodiments in which, formally speaking, step E) interrupts step D) are feasible, i.e., initially the first solvent is at least partially removed, a second solvent is introduced for washing purposes and then the second solvent and any residue of the first solvent are removed. Hardening or a hardening step, as described above, is generally performed after the washing step. The second solvent can be a pure solvent or a solvent mixture. If first and second solvents are present together, they occasionally may no longer be distinguishable from each other. They can also only be referred to together as a "solvent".

In step E), just like in step B), the amphiphilic block copolymer can be bloated by the solvent. By-products, e.g., salts, which are formed as a result of the reaction in step C), can be dissolved or suspended in the second solvent and then removed together with the second solvent. Likewise, volatile by-products can be expelled by a washing step. The second solvent can be removed mechanically or via a gaseous phase, e.g., by applying a vacuum. In order to remove the second solvent, a reduced pressure and/or an elevated temperature can be used, for example. For example, a reduced pressure of 50 to 800 mbar, in particular 70 to 500 mbar, for example, 90 to 150 mbar, can be applied. In this case, the temperature can be increased to 30° C. to 75° C., in particular 40° C. to 60° C., for example, 50° C. Step E) ensures that the concentration of by-products or decomposition products in the optical element or in the amphiphilic block copolymer is reduced. To this end, several washing steps can also be performed.

According to a further embodiment, the first solvent and/or the second solvent are selected independently of each other from the group comprising water, an alcohol, and a combination thereof. The precursors used can be effectively dissolved or suspended in these solvents. In particular, they are dissolved therein. Furthermore, these solvents are suitable to suspend, for example, particles which contain converter materials which means that these can likewise be introduced into the optical element.

According to one development of this embodiment, a combination of water and alcohol is used as the first solvent and/or as the second solvent. A ratio of water to alcohol in the range of 20:80 to 80:20 can be used in particular. The alcohol can be, for example, methanol, ethanol or a combination thereof, but in particular methanol. Water/alcohol mixtures are able to dissolve or suspend the above-mentioned precursor compounds and permit uniform bloating of the amphiphilic block copolymer. For this purpose, in particular an alcohol proportion in the solvent is helpful since alcohols interact with the hydrophobic polymers of the block copolymer better than water does.

In a further aspect of the application, a method for producing an optoelectronic device having an optical element is provided. According to at least one embodiment, the method comprises the steps of: providing a housing, in which a radiation-emitting or radiation-receiving semiconductor chip is arranged, and producing an optical element in accordance with a method according to at least one embodiment according to the application, in particular according to any one of claims 9 to 15, in a beam path of the device.

In particular, devices according to at least one embodiment of the application can be produced in this manner.

The optical element is preferably produced in a recess of the housing, in which the semiconductor chip is also arranged, so that a casting compound is formed which at least partially surrounds the semiconductor chip. As the device, in particular an LED having a light-emitting semiconductor chip can be produced.

The advantageous properties of the optical element can be substantially traced back to the production method according to the application. Therefore, an optical element is provided which can be obtained using a method according to at least one embodiment, in particular a method according to any one of claims 9 to 15.

BRIEF DESCRIPTION OF THE DRAWINGS

The invention will be explained in more detail hereinafter with reference to the drawings, in particular with the aid of exemplified embodiments. Thereby, like, similar or like-acting elements are provided with like reference numerals. The figures and the size ratios of the elements illustrated in the figures with respect to each other are not to be considered as being to scale. Rather, individual elements can be illustrated excessively large and/or in a simplified manner for ease of representation and/or for better understanding.

In the figures.

DETAILED DESCRIPTION OF ILLUSTRATIVE EMBODIMENTS

Figure 1:
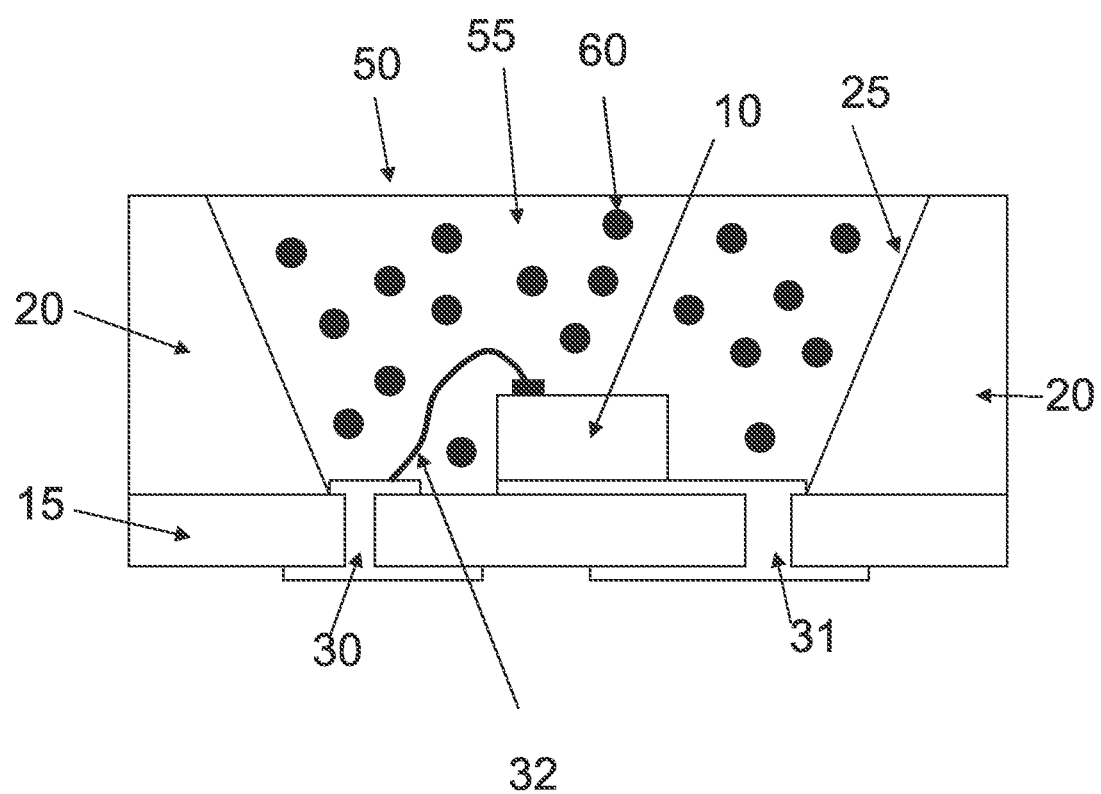
FIG. 1 shows a schematic cross-section through a device having an optical element.

In FIG. 1, a device according to one embodiment of the application is illustrated representatively using the example of an LED. In this case, the device comprises a housing 20 in conjunction with a carrier substrate 15. The housing 20 can comprise a ceramic or a heat-resistant and radiation-resistant plastic. A semiconductor chip 10 is arranged in a recess 25 of the housing 20 and emits radiation during operation of the device. The sidewalls of the recess 25 are chamfered in this case and can comprise a reflective material. The semiconductor chip 10 can be supplied with current via electrically conductive connections 30, 31 and a bond wire 32. The device can comprise further conventional elements, even if these are not illustrated in detail, e.g., a (fitted) lens or a conversion element.

The optical element 50 is formed as a casting compound or volume casting compound. It surrounds the semiconductor chip 10 and fills the recess 25. In accordance with one embodiment of the method according to the application, it can be produced directly in the recess 25 of the housing 20. In principle, any embodiment of an optical element 50 according to the application can be formed in the device of FIG. 1 (and likewise also in that of FIG. 2). Therefore, thermally conductive nanoparticles 60 consisting of a metal, a metal oxide or a metal hydroxide, homogeneously distributed in the amphiphilic block copolymer 55 are illustrated only schematically (and greatly enlarged). The block copolymer 55 can consist, for example, of polysiloxane polymers and polyethylene glycol polymers cross-linked with each other.

The nanoparticles 60 have an average diameter of <100 nm, in particular ≤50 nm. They are distributed homogeneously in the block copolymer 55 and in particular are hardly agglomerated or sedimented, which means that no (or only a few) structures at which visible light is scattered are produced therefrom. Preferred materials for the nanoparticles 60 are cobalt, gold, silver, platinum, lanthanide hydroxide, e.g., lanthanum hydroxide. The nanoparticles 60 can form percolation paths which are characterised by an extremely high thermal conductivity (not shown in this case). Percolation paths can form, with the block copolymer 55, an interpenetrating network. In the case of nanoparticles 60 consisting of metal, these can be present, for example, in a concentration of up to 20 vol. %.

The optical element 50 is characterised by a high thermal conductivity of ≥0.4 W/(m*K), in particular of 0.4 to 5 W/(m*K), which means that heat can be effectively dissipated from the semiconductor chip 10 to the surface of the optical element 50 and be discharged to the surrounding area. Since damage such as embrittlement or cracking owing to the effects of heat or overheating is reduced, the device has a long service life. Since the nanoparticles 60 do not, or hardly, scatter visible light, an extremely high luminous efficiency is obtained for the device in addition to the improved thermal management.

Figure 2:
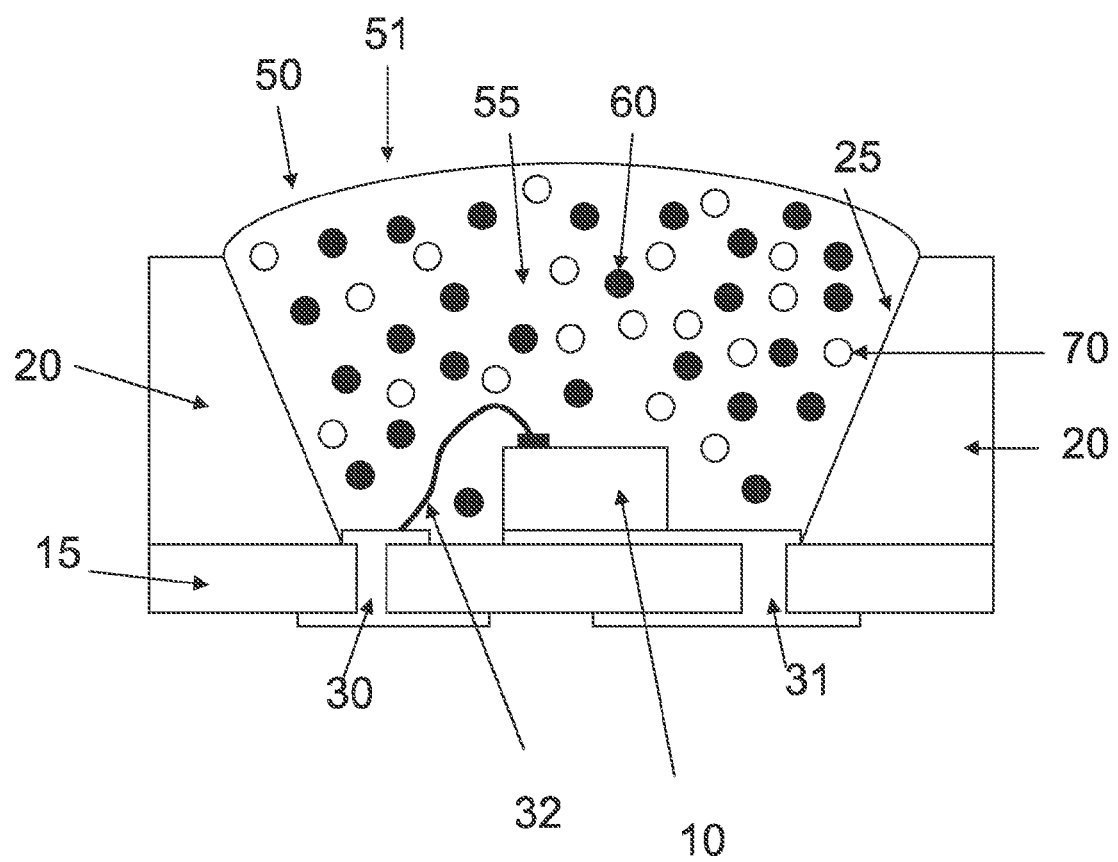
FIG. 2 shows a schematic cross-section through a device having an optical element for volume conversion.

FIG. 2 illustrates a further device having an optical element 50 according to at least one embodiment, which is similar to the device of FIG. 1. The optical element 50 is formed in this case as a casting compound having a lens 51. Particles 70 containing converter materials are present in the optical element 50 which means that the optical element 50 is formed for volume conversion. During operation of the device, the generated conversion heat can be effectively dissipated from the converter material 70 owing to the high thermal conductivity of the optical element 50. Overheating is thereby avoided, and a stable chromaticity co-ordinate in the CIE diagram is obtained for the converted radiation.

The particles 70 containing converter materials can form, together with the nanoparticles 60, percolation paths which permit effective dissipation of conversion heat, which is generally higher than in embodiments without percolation paths. If the converter materials 70 themselves are not electrically conductive, the percolation paths can also be formed with metallic nanoparticles 60, without short-circuits occurring during operation of the device.

Figure 3A:
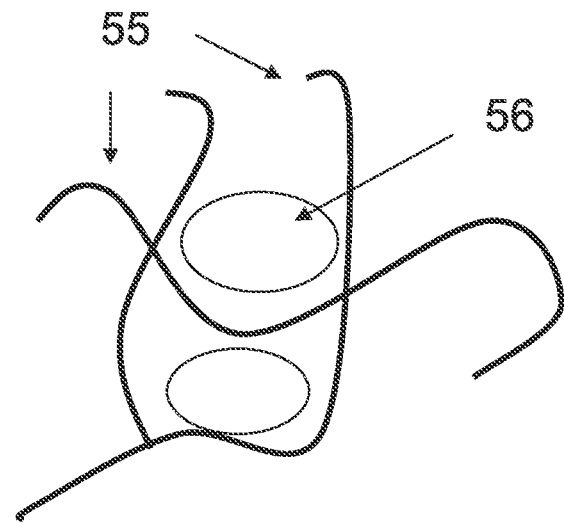
FIG. 3A shows a schematic illustration of an amphiphilic block copolymer.

FIG. 3A shows a schematic illustration of an amphiphilic block copolymer 55, as provided, for example, in step A) of the method described above. Particles 70 containing converter materials can be distributed therein (not shown). Hollow spaces or cavities 56 are present in the network of the block copolymer 55 (in this case illustrated as ellipses).

Figure 3B:
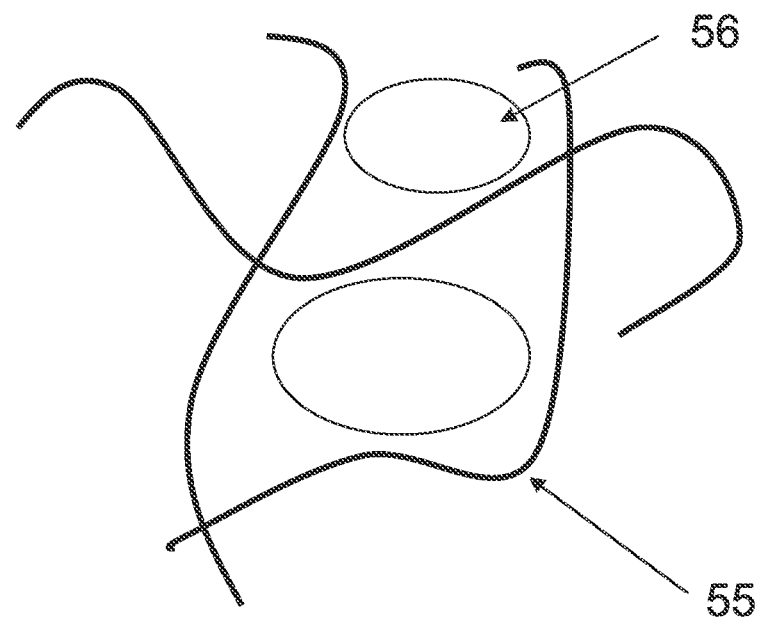
FIG. 3B shows a schematic illustration of an amphiphilic block copolymer in step B)

FIG. 3B shows a schematic illustration of an amphiphilic block copolymer 55, as can be present in step B) of the method. The hollow spaces or cavities 56 in the block copolymer 55 are enlarged by the "bloating" action, i.e., the introduction of the solution, suspension or dispersion of a precursor. The precursor can be uniformly distributed in the block copolymer 55 in this manner.

Figure 3C:
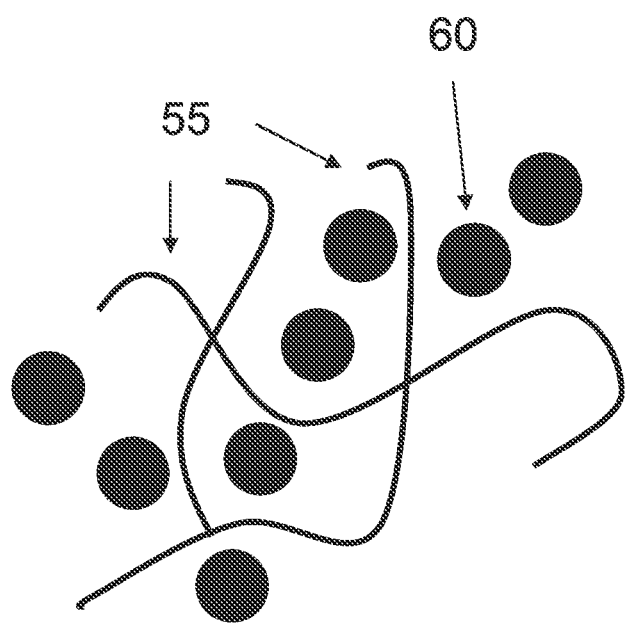
FIG. 3C shows a schematic illustration of a section of an optical element.
Figure 3D:
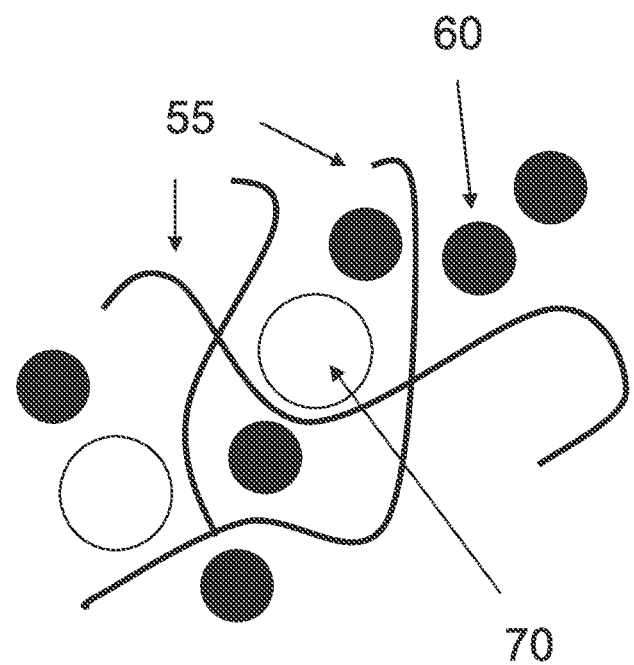
FIG. 3D shows a schematic illustration of a section of an optical element for volume conversion.

FIGS. 3C and 3D show schematic illustrations of sections of optical elements 50 according to the application, as can be present after step D) of the method or in the finished device, e.g., as shown in FIG. 1 or 2. In FIG. 3C, the nanoparticles 60 produced in situ form percolation paths which, together with the block copolymer 55, form an interpenetrating network. The nanoparticles 60 contact each other at least partially, which is not illustrated here for the sake of clarity. FIG. 3D illustrates in a similar manner that particles 70 containing converter materials form, together with the nanoparticles 60, percolation paths, whereby the conversion heat can be effectively dissipated and the above-described advantages are achieved.

EXEMPLIFIED EMBODIMENTS

Example 1

1) A mixture consisting of water, methanol, cobalt acetate and triethylamine is introduced at approximately 40° C. into a polymer system (amphiphilic block copolymer) with poly (dimethyl siloxane) and polyethylene glycol in a ratio of 70:30, wherein the polymer system swells. 2) Then, an aqueous sodium borohydride solution is added. 3) The obtained mixture is heated to 40° C. to 60° C. for approximately 30 min (so-called "staging time"), wherein cobalt is formed. 4) The solvents are removed in a vacuum, approximately 100 mbar, at temperatures of approximately 50° C. The solvents are almost completely removed in this case. 5) The polymer system once more has water added thereto so that it swells. 6) The solvents are then removed in a vacuum of approximately 100 mbar at temperatures of approximately 50° C. 7) The mixture is then hardened. For this purpose, the temperature is increased to 120° C. to 160° C. for 1 to 4 h.

Using this method, an optical element is formed from amphiphilic block copolymers consisting of poly(dimethyl siloxane) and polyethylene glycol and nanoparticles distributed therein consisting of cobalt having an average diameter of ≤50 nm. The method can be performed directly in a housing, for example, an LED, or in a recess of the housing with a semiconductor chip arranged therein, which means that a casting compound surrounding the semiconductor chip is formed as the optical element.

Example 2

In step 1), a mixture consisting of water, methanol and silver nitrate is introduced. Step 2) is not performed. As step 3), UV radiation is applied for 5 to 10 min. Otherwise, the procedure from example 1 is adopted in order to produce an optical element having nanoparticles consisting of silver.

Example 3

In step 1), a mixture consisting of water, methanol, silver tetrachloroaurate and trimethylamine is introduced. Otherwise, the procedure from example 1 is adopted in order to produce an optical element having gold-containing nanoparticles.

The invention is not limited to the exemplified embodiments by the description with the aid of said embodiments. Rather, the invention includes any new feature and any combination of features included in particular in any combination of features in the claims and any combination in the exemplified embodiments, even if this feature or this combination itself is not explicitly stated in the claims or exemplified embodiments.

The invention claimed is:

1. An optoelectronic device comprising:
   a housing;
   a radiation-emitting or radiation-receiving semiconductor chip which is arranged in the housing; and
   an optical element which is arranged in a beam path of the device,
   wherein the optical element comprises an amphiphilic block copolymer containing polysiloxane as a hydrophobic polymer and a hydrophilic polymer,
   wherein thermally conductive nanoparticles are distributed in the amphiphilic block copolymer and comprise a material selected from the group consisting of a metal, a metal oxide, a metal hydroxide and a combination thereof, and
   wherein the hydrophilic polymer is selected from the group consisting of polyethylene glycol (PEG), polyacrylamides, polyacrylic acid, poly(methylvinylether-alt-maleic acid anhydride), poly(methylvinylether-alt-maleic acid), poly(isobutene-co-maleic acid), poly(2-ethyl acrylic acid), poly(2-hydroxyethyl methacrylate), poly (2-propyl acrylic acid) and a combination thereof.

2. The device according to claim 1, wherein a mass ratio of hydrophobic polymer to hydrophilic polymer in the amphiphilic block copolymer is between 50:50 and 95:5.

3. The device according to claim 1, wherein the nanoparticles have an average diameter of ≤50 nm.

4. The device according to claim 1, wherein the nanoparticles comprise a material which is selected from the group consisting of cobalt, gold, silver, platinum, lanthanide hydroxide, lanthanide oxide, aluminium oxide and a combination thereof.

5. The device according to claim 1, wherein the nanoparticles form percolation paths in the optical element.

6. The device according to claim 1, wherein the optical element comprises particles which contain converter materials and which, together with the nanoparticles, form percolation paths.

7. The device according to claim 1, wherein the optical element is a casting compound which at least partially surrounds the semiconductor chip.

8. An optical element comprising:
an amphiphilic block copolymer containing polysiloxane as a hydrophobic polymer and a hydrophilic polymer; and
thermally conductive nanoparticles which are distributed in the amphiphilic block copolymer and comprise a material selected from the group consisting of a metal, a metal oxide, a metal hydroxide and a combination thereof,
wherein the hydrophilic polymer is polyethylene glycol (PEG).

* * * * *